United States Patent
Xiang

(10) Patent No.: US 11,201,187 B2
(45) Date of Patent: Dec. 14, 2021

(54) CMOS IMAGE SENSOR PACKAGING STRUCTURE AND FABRICATION METHOD THEREOF, AND CAMERA DEVICE

(71) Applicant: Ningbo Semiconductor International Corporation, Ningbo (CN)

(72) Inventor: Yanghui Xiang, Ningbo (CN)

(73) Assignee: Ningbo Semiconductor International Corporation, Ningbo (CN)

( * ) Notice: Subject to any disclaimer, the term of this patent is extended or adjusted under 35 U.S.C. 154(b) by 0 days.

(21) Appl. No.: 16/671,565

(22) Filed: Nov. 1, 2019

(65) Prior Publication Data

US 2020/0273904 A1 Aug. 27, 2020

Related U.S. Application Data

(63) Continuation of application No. PCT/CN2019/081075, filed on Apr. 2, 2019.

(30) Foreign Application Priority Data

Feb. 27, 2019 (CN) .......................... 201910147029.5

(51) Int. Cl.
*H01L 27/146* (2006.01)
*H04N 5/378* (2011.01)

(52) U.S. Cl.
CPC .... *H01L 27/14643* (2013.01); *H01L 27/1464* (2013.01); *H01L 27/14607* (2013.01);
(Continued)

(58) Field of Classification Search
CPC ......... H01L 27/14689; H01L 27/14636; H01L 27/1464; H01L 27/14607; H01L 27/1469;
(Continued)

(56) References Cited

U.S. PATENT DOCUMENTS

2017/0092680 A1* 3/2017 Kwon .................. H01L 23/5226
2019/0131336 A1* 5/2019 Yoon ..................... H01L 31/102
(Continued)

FOREIGN PATENT DOCUMENTS

CN 108269814 A 7/2018

*Primary Examiner* — Cuong B Nguyen
(74) *Attorney, Agent, or Firm* — Anova Law Group, PLLC

(57) ABSTRACT

A CMOS image sensor packaging structure and a fabrication method thereof, and a camera device are provided. The packaging structure includes a pixel circuit substrate including a photosensitive region and a readout circuit region. A pixel array is disposed in the photosensitive region, and the readout circuit including a circuit interconnection terminal is disposed in the readout circuit region. The pixel circuit substrate includes a first surface and a second surface that are oppositely disposed. The packaging structure also includes a bonding layer disposed on the first surface. Moreover, the packaging structure includes a signal processing chip disposed above the first surface through the bonding layer. The signal processing chip includes a chip interconnection terminal. In addition, the packaging structure includes an interconnection structure electrically connected to the chip interconnection terminal and the circuit interconnection terminal. Further, the packaging structure includes a redistribution layer disposed on the second surface.

20 Claims, 2 Drawing Sheets

(52) U.S. Cl.
CPC .. *H01L 27/14636* (2013.01); *H01L 27/14689* (2013.01); *H04N 5/378* (2013.01)

(58) Field of Classification Search
CPC ......... H01L 27/14634; H01L 27/14–32; H01L 51/42–448; H01L 27/14681; H01L 25/167; H01L 31/107; H01L 27/14643–14663; H04N 5/378
See application file for complete search history.

(56) References Cited

U.S. PATENT DOCUMENTS

2019/0237375 A1* 8/2019 Jung ................ H01L 24/81
2019/0355706 A1* 11/2019 Enquist ............ H01L 27/14618

* cited by examiner

CMOS IMAGE SENSOR PACKAGING STRUCTURE AND FABRICATION METHOD THEREOF, AND CAMERA DEVICE

CROSS-REFERENCES TO RELATED APPLICATIONS

This application is a continuation application of PCT Patent Application No. PCT/CN2019/081075, filed on Apr. 2, 2019, which claims priority to Chinese patent application No. 201910147029.5, filed on Feb. 27, 2019, the entirety of all of which is incorporated herein by reference.

FIELD OF THE DISCLOSURE

The present disclosure generally relates to the field of image sensor and, more particularly, relates to a CMOS image sensor packaging structure and fabrication method thereof, and a camera device.

BACKGROUND

For photographing scenery, a digital camera is currently deployed on a device such as a laptop, a tablet, a smart phone, and a smart toy, etc. The commonly used digital camera projects a generated optical image onto a surface of a photosensitive element through a camera lens, and the light is split into different shades by a filter on the surface of the photosensitive element. A pixel unit corresponding to each filter perceives each shade of light to generate an analog signal with different intensity. Analog signals are collected by a circuit of the photosensitive element, and converted into digital signals by an analog-to-digital converter. The digital signals are processed by an image signal processor (ISP), sent to a mobile phone processor for processing, and then transmitted to a memory card for storage to form an image that can be viewed on a screen.

A currently commonly used photosensitive element is a back-illuminated complementary metal-oxide semiconductor (CMOS) image sensor. Compared with a charge coupled device (CCD) image sensor, the CMOS image sensor enables more flexible image capture, higher sensitivity, wider dynamic range, higher resolution, lower power consumption, and better system integration, etc. Moreover, the light is incident from a back side of the CMOS image sensor, and is illuminated onto the photosensitive element without passing through an interconnection layer on the photosensitive element. Therefore, the loss of light may be reduced, and the light energy that can be obtained by a single pixel unit in a unit time is substantially large, which obviously improves the image quality.

However, as the requirements for the size and image quality of the CMOS image sensor increase, the structure of the CMOS image sensor packaging structure still desires to be further improved.

The disclosed CMOS image sensor packaging structure and fabrication method thereof, and camera device are directed to solve one or more problems set forth above and other problems in the art.

BRIEF SUMMARY OF THE DISCLOSURE

One aspect of the present disclosure provides a CMOS image sensor packaging structure. The CMOS image sensor packaging structure includes a pixel circuit substrate including a photosensitive region and a readout circuit region. A pixel array of the CMOS image sensor is disposed in the photosensitive region, and the readout circuit is disposed in the readout circuit region. The readout circuit includes a circuit interconnection terminal, and the pixel circuit substrate includes a first surface and a second surface that are oppositely disposed. The CMOS image sensor packaging structure also includes a bonding layer disposed on the first surface. Moreover, the CMOS image sensor packaging structure includes a signal processing chip disposed above the first surface through the bonding layer. The signal processing chip includes a chip interconnection terminal. In addition, the CMOS image sensor packaging structure includes an interconnection structure electrically connected to the chip interconnection terminal and the circuit interconnection terminal. Further, the CMOS image sensor packaging structure includes a redistribution layer disposed on the second surface. The redistribution layer is electrically connected to the interconnection structure.

Another aspect of the present disclosure provides a camera device. The camera device includes a CMOS image sensor packaging structure. The CMOS image sensor packaging structure includes a pixel circuit substrate including a photosensitive region and a readout circuit region. A pixel array of the CMOS image sensor is disposed in the photosensitive region, and the readout circuit is disposed in the readout circuit region. The readout circuit includes a circuit interconnection terminal, and the pixel circuit substrate includes a first surface and a second surface that are oppositely disposed. The CMOS image sensor packaging structure also includes a bonding layer disposed on the first surface. Moreover, the CMOS image sensor packaging structure includes a signal processing chip disposed above the first surface through the bonding layer. The signal processing chip includes a chip interconnection terminal. In addition, the CMOS image sensor packaging structure includes an interconnection structure electrically connected to the chip interconnection terminal and the circuit interconnection terminal. Further, the CMOS image sensor packaging structure includes a redistribution layer disposed on the second surface. The redistribution layer is electrically connected to the interconnection structure.

Another aspect of the present disclosure provides a method for forming a CMOS image sensor packaging structure. The method includes providing a pixel circuit substrate and a signal processing chip. The pixel circuit substrate includes a photosensitive region and a readout circuit region. A pixel array of the CMOS image sensor is disposed in the photosensitive region, and the readout circuit is disposed in the readout circuit region. The readout circuit includes a circuit interconnection terminal, the pixel circuit substrate includes a first surface and a second surface that are oppositely disposed, and the signal processing chip includes a chip interconnection terminal. The method also includes bonding the signal processing chip onto the pixel circuit substrate by using a bonding layer. The bonding layer is disposed on the first surface. In addition, the method includes forming an interconnection structure, wherein the interconnection structure is electrically connected to the chip interconnection terminal and the circuit interconnection terminal. Further, the method includes forming a redistribution layer on the second surface, wherein the redistribution layer is electrically connected to the interconnection structure.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Figure 1:
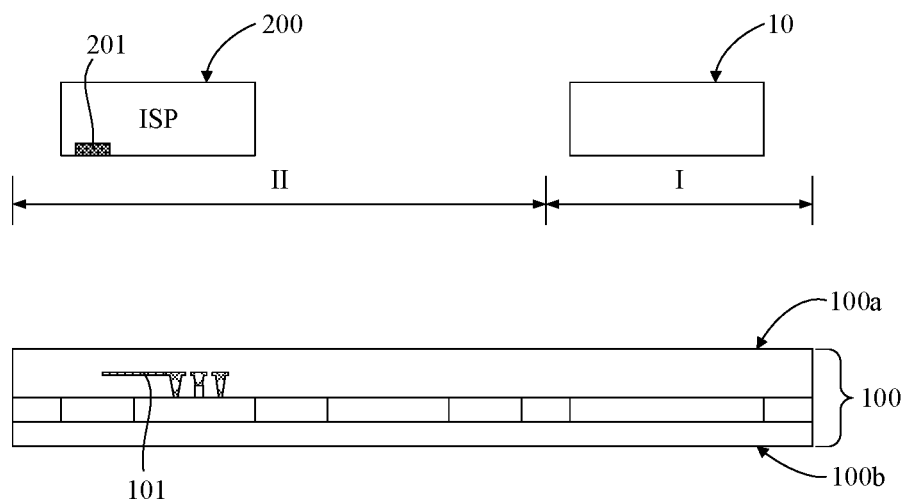
FIG. 1 illustrates a schematic cross-sectional view of a pixel circuit substrate in a method for forming a CMOS image sensor packaging structure consistent with various disclosed embodiments of the present disclosure.

Reference will now be made in detail to exemplary embodiments of the disclosure, which are illustrated in the accompanying drawings. However, those skilled in the art may easily understand that the present disclosure may be implemented without one or more of these details. In certain examples, some well-known technical features in the art are not described herein to avoid confusion with the present disclosure.

A current CMOS image signal processor is often integrated by system-on-chip (SOC) technique on a pixel circuit substrate disposed with photosensitive elements, or bonded to the pixel circuit substrate disposed with the photosensitive elements by a wafer-level bonding method (mostly using metal and oxide hybrid bonding), the process is difficult and the cost is high. Further, the wafer-level bonding method causes two wafers to be bonded together, and the processing difficulty on a defective chip on a signal processing wafer is substantially high, which also increases cost. As the requirements for the size, cost, and the like of the packaging structure of the CMOS image sensor increase, the packaging structure and packaging method of the CMOS image sensor still desire to be improved.

Based on the above research, the present disclosure provides a CMOS image sensor packaging structure. A signal processing chip may be bonded onto a surface of a pixel circuit substrate, and an interconnection structure may be formed to be electrically connected to a chip interconnection terminal of the signal processing chip and a circuit interconnection terminal of a readout circuit, respectively. A redistribution layer electrically connected to the interconnection structure may be formed on a second surface of the pixel circuit substrate, thereby realizing electrical interconnection between the signal processing chip and the pixel circuit substrate, and improving the structure of the packaging structure. The independent signal processing chip may facilitate providing desired computing power and image quality. Further, a defective chip on the wafer may be discarded when being bonded, and, thus, the process difficulty may be substantially low compared with the wafer-level bonding method. The signal processing chip may be bonded onto the pixel circuit substrate, which may increase the design margin of the pixel circuit substrate, and may facilitate reducing the overall size of the packaging structure.

The CMOS image sensor packaging structure and fabrication method therefore, and the camera device in the present disclosure will be further described in detail below with reference to the accompanying drawings and specific embodiments. Advantages and features of the present disclosure will become more apparent from the description. It should be understood that the following examples are merely illustrative specific embodiments of the present disclosure and are not intended to limit the scope of the present disclosure.

It should be noted that the drawings are in a very simplified form and each uses non-precise proportions, to conveniently and clearly illustrate the purpose of the embodiments of the present disclosure. Corresponding numerals and numbers in different drawings generally refer to the corresponding parts unless otherwise specified. Also, the terms "first", "second", etc., are used in the following to distinguish between similar elements, and are not necessarily used to describe a particular order or chronological order. It should be understood that the terms used in this way are interchangeable as appropriate. For example, the embodiments of the present disclosure described herein can be practiced in a sequence different from the sequence described or illustrated herein. Similarly, when the methods described herein comprise a series of steps, the order of the steps presented herein is not necessarily the only order in which the steps can be performed, some of the steps can be omitted and/or some steps not described herein can be added to the method.

Figure 4:
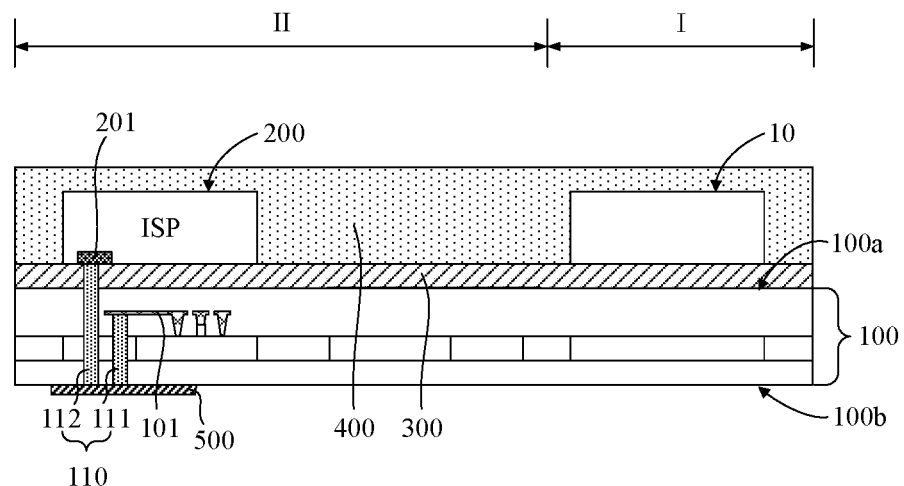
FIG. 4 illustrates a schematic cross-sectional view of a semiconductor structure after forming a redistribution layer in a method for forming a CMOS image sensor packaging structure consistent with various disclosed embodiments of the present disclosure.

The present disclosure first provides a CMOS image sensor packaging structure. Referring to FIG. 4, the CMOS image sensor packaging structure in the present disclosure may include a plurality of portions, e.g., a pixel circuit substrate 100, a bonding layer 300, and a signal processing chip 200, etc. In one embodiment, a photosensitive region I and a readout circuit region II may be disposed in the pixel circuit substrate 100. FIG. 4 illustrates positions of the photosensitive region I and the readout circuit region II, and ranges of the photosensitive region I and the readout circuit region II may not be limited to the region illustrated in the figure. A pixel array of the CMOS image sensor may be disposed in the photosensitive region I. The pixel array of the CMOS image sensor may refer to an array of pixel units including photodiodes of the CMOS image sensor. A readout circuit may be disposed in the readout region II. The photodiode and the readout circuit may be formed in a corresponding region in the pixel circuit substrate 100 using a semiconductor process. The readout circuit may include a circuit connection terminal for interconnection, e.g., a circuit interconnection terminal 101 as illustrated in FIG. 4. For illustrative purposes, the pixel circuit substrate 100 in the present disclosure may include a first surface 100*a* and a second surface 100*b* that are oppositely disposed. The bonding layer 300 may be laid on the first surface 100*a* of the pixel circuit substrate 100. The signal processing chip 200 may be disposed above the first surface 100*a* through the bonding layer 300. A redistribution layer (RDL) 500 may be laid on the second surface 100*b*. In another embodiment, the signal processing chip may be disposed on the second surface, and the redistribution layer may be disposed on another side that is opposite to the second surface.

The signal processing chip 200 may include a chip interconnection terminal 201. The chip interconnection terminal 201 may correspond to a contact pad disposed on a surface of the signal processing chip 200. The contact pad of the chip interconnection terminal 201 may be exposed on the surface of the signal processing chip 200 or covered by a substantially thin dielectric material.

The pixel circuit substrate 100 may be a substrate on which a CMOS image sensor is fabricated. In one embodiment, the substrate may be a silicon substrate or a silicon-on-insulator (SOI) substrate, etc. The substrate may be made of a material including germanium, silicon germanium, silicon carbide, gallium arsenide, indium gallium, or any other group III-V compound. The substrate may be a silicon wafer. The CMOS image sensor in the disclosed embodiments may be a back-illuminated CMOS image sensor. The back-illuminated CMOS image sensor on a back side of the substrate, e.g., the side opposite to a side of the substrate on which the photodiode is formed, may often be thinned and may include a dielectric layer used for planarization, a color filter layer (not illustrated) used for obtaining light of different colors, and a lens layer (not illustrated) for increasing the amount of incident light. On a front side of the substrate, e.g., the side on which the photodiode and the interconnection layer are sequentially formed, the pixel circuit substrate may include a photosensitive layer provided with a plurality of photodiodes. The photosensitive layer may be provided with millions of pixel cells or pixel units that are distributed in an array. In one embodiment, each pixel cell may include a photodiode and a plurality of MOS transistors used as a driving circuit. During operation, the light may be incident from the lens layer, pass through the color filter layer and the dielectric layer to enter the pixel units in the photosensitive layer and to form a photocurrent. In the pixel circuit substrate, a plurality of different regions may be disposed according to different functions. The pixel unit may often be disposed in the photosensitive region I, and a peripheral circuit may be disposed around the photosensitive region I. Therefore, the photosensitive region I and the readout circuit region II may also respectively correspond to different regions on the surface of the pixel circuit substrate 100. The interconnection layer formed on the photosensitive layer may include a plurality of layers of interconnected metal layers stacked together and a plug layer connecting adjacent two interconnected metal layers. The interconnection layer may be used to electrically connect the photodiode, the driving circuit, and the peripheral circuit, to process the photocurrent signal of the photodiode. The peripheral circuit may specifically include an analog signal processing circuit, an analog-to-digital conversion circuit, a digital logic circuit, and a readout circuit, etc. Further, the readout circuit may be disposed in the readout circuit region II. In the readout circuit region II, the read out circuit may output the processed digital image signal on the pixel circuit substrate 100, or may be used to transmit any other signal. The outputted digital image signal may be further processed by an image signal processing circuit (ISP) or an image signal processing chip. The specific structure of the pixel circuit substrate may be implemented with reference to the disclosed technology. In another embodiment, the CMOS image sensor may also employ a front-illuminated CMOS image sensor, or a stacked CMOS image sensor.

In the disclosed embodiments, a side surface of the pixel circuit substrate 100 on which the interconnection layer is formed may be referred as the first surface 100a, and another side surface on which light is incident may be referred as the second surface 100b. The pixel circuit substrate 100 corresponding to the readout circuit region II may sequentially include the dielectric layer, a circuit element layer, and the interconnection layer along a direction from the second surface 100b to the first surface 100a. The pixel circuit substrate may also include the lens layer and the color filter layer, which are not illustrated. The dielectric layer may be used to planarize the surface of the substrate and as an electrical isolation layer. The circuit element layer may include the above-described readout circuit, and the circuit element layer may be formed together with the photosensitive layer in the photosensitive region I. The interconnection layer may be superposed on the circuit element layer and disposed with the electrical connection terminal of the readout circuit. The readout circuit may include a plurality of electrical connection terminals, e.g., the circuit interconnection terminal 101. The circuit interconnection terminal 101 may be used to interconnect the readout circuit and the signal processing chip 200, to output the image digital signal to the signal processing chip 200 or to execute any other function that is desired after being interconnected with the signal processing chip 200.

In one embodiment, the signal processing chip 200 may be disposed on a side of the first surface 100a of the pixel circuit substrate 100. The signal processing chip 200 may be an image signal processor (ISP) or a digital signal processor (DSP), etc. An image signal processor is used as an example, which may perform processing, e.g., automatic exposure control (AEC), automatic gain control (AGC), automatic white balance (AWB), color correction, lens shading, Gamma correction, bad point removal, and auto black level, etc., on the output data of the pixel circuit substrate 100.

Compared with a signal processing circuit integrated on a pixel circuit substrate, the signal processing chip 200 may be a chip that is independently designed and fabricated. In one embodiment, the signal processing chip 200 may be a bare chip to be packaged, which may be different from a chip on a wafer that has not been cut. With respect to the signal processing circuit integrated on the pixel circuit substrate, the signal processing chip 200 may have desired computing power and image quality. When being used in a camera device such as a mobile phone, the independent signal processing chip may be customized by the mobile phone manufacturer from the chip provider, which may facilitate implementation of desired fit with any other component of the camera, facilitate the reduction of the lateral size of the pixel circuit substrate, thereby reducing the overall size of the packaging structure. In addition, compared with the wafer-level bonding method, the defective chip on the wafer may be discarded, and, thus, the process difficulty may be substantially low. It should be understood that the present disclosure focuses on the description of the CMOS image sensor packaging structure including the pixel circuit substrate 100 and the signal processing chip 200 disposed on the first surface 100a thereof, but the CMOS image sensor packaging structure in the present disclosure may include any other suitable component(s). Any other circuit chip, e.g., an analog signal processing chip, an analog-to-digital conversion chip, a logic chip, etc., may be disposed on/bonded to the pixel circuit substrate 100. Any other device, e.g., a power device, a bipolar device, a resistor, and a capacitor, etc., may be disposed on the pixel circuit substrate 100. Devices and connection relationships known in the art may also be included.

The signal processing chip 200 may be distributed at intervals on the bonding layer 300 of the first surface 100a, and may be fixed with respect to the pixel circuit substrate 100. The bonding layer 300 may be made of a material including an oxide or any other suitable material. In one embodiment, the bonding layer 300 may be made of a bonding material. In other words, the signal processing chip 200 may be bonded to the first surface 100a of the pixel circuit substrate 100 by fusion bonding or vacuum bonding. The bonding layer 300 may further include an adhesive material, e.g., a die attach film (DAF) or a dry film. In other words, the signal processing chip 200 may be bonded to the first surface 100a of the pixel circuit substrate 100 by an adhering method. In one embodiment, the bonding layer 300 may be a dry film. The dry film may be a viscous photoresist film, and may undergo a polymerization reaction to form a stable substance to be adhered onto an adhesive surface after being irradiated under the ultraviolet light. The signal processing chip 200 may be adhered on an upper surface of the dry film. In one embodiment, the signal processing chip 200 may be disposed on the first surface 100a of the pixel circuit substrate 100 corresponding to the readout circuit region II of the pixel circuit substrate 100, to avoid the influence on the photosensitive region I. In certain embodiments, the signal processing chip 200 may be bonded onto any other region of the first surface 100a without affecting the incidence of light entering the pixel array in the photosensitive region.

The CMOS image sensor packaging structure may further include an encapsulation layer 400 disposed above the first surface 100a. In one embodiment, the encapsulation layer 400 may be made of a moldable material, which may soften or flow during molding to form a certain shape. The encapsulation layer 400 may also be made of a material capable of undergoing a chemical reaction to be cross-linked and cured. In one embodiment, the encapsulation layer 400 may be a thermosetting resin. In another embodiment, the encapsulation layer 400 may be made of epoxy resin. The encapsulation layer 400 may also include a filler material, and various additives.

An area of a region in the first surface 100a of the pixel circuit substrate 100 corresponding to the photosensitive region I may be substantially large, and an area of a region thereof corresponding to the peripheral circuit may be substantially small. Therefore, to improve the packaging effect, a dummy chip 10 may be bonded to the bonding layer 300 corresponding to the photosensitive region I. The encapsulation layer 400 may also cover the dummy chip 10. In one embodiment, the dummy chip may be a silicon chip. In addition, according to the specific condition of the pixel circuit substrate 100 and the size of the dummy chip, one or more dummy chips may be bonded onto the pixel circuit substrate 100. The dummy chip 10 may facilitate controlling the warpage of the packaging structure. It should be noted that when the dummy chip 10 is disposed on a region corresponding to the photosensitive region I, the incident light may not be affected. In one embodiment, when the incident light is set to enter the pixel array from the second surface 100b of the pixel circuit substrate 100, the dummy chip 10 may be disposed on the first surface 100a corresponding to the photosensitive region I.

The CMOS image sensor packaging structure in the present disclosure may further include an interconnection structure 110. The interconnection structure 110 may be electrically connected to the circuit interconnection terminal 101 of the readout circuit, electrically connected to the chip interconnection terminal 201 of the signal processing chip 200, and coupled to the pixel circuit substrate 100. The interconnection structure 110 may include one or more electrical contacts, an electrical connection part, and an electrical connection wire formed therebetween, disposed in the pixel circuit substrate 100 and the bonding layer. In one embodiment, the interconnection structure 110 may be disposed in the pixel circuit substrate 100 and on the first surface 100a thereof, and may be electrically connected to the chip interconnection terminal 201 of the signal processing chip 200 and the circuit interconnection terminal 101 of the readout circuit. For illustrative purposes, a contact pad corresponding to the chip interconnection terminal 201 of the signal processing chip 200 may be disposed toward the first surface 100a.

In one embodiment of the present disclosure, the interconnection structure 110 may include a first conductive plug 111 disposed in the pixel circuit substrate 100. A terminal of the first conductive plug 111 may be in contact with and electrically connected to the circuit interconnection terminal 101 of the readout circuit, and another terminal thereof may face toward the second surface 100b to be electrically connected to the redistribution layer 500. In another embodiment, the interconnection structure 110 may also include a second conductive plug 112. A terminal of the second conductive plug 112 may be in contact with and electrically connected to the chip interconnection terminal 201 of the signal processing chip 200, and another terminal thereof may face toward the second surface 100b to be electrically connected to the redistribution layer 500. Referring to FIG. 4, in certain embodiments, the interconnection structure 110 may include both the first conductive plug 111 and the second conductive plug 112.

It should be understood that the present disclosure is not limited thereto. In certain embodiments, the interconnection structure 110 may include other forms. In one embodiment, referring to FIG. 5, the interconnection structure 110 may include a third conductive plug 113 disposed in the pixel circuit substrate 100, and an electrical connection part 120 disposed on the first surface 100a. The third conductive plug 113 may be electrically connected to the circuit interconnection terminal 101 of the readout circuit and the electrical connection part 120. The electrical connection part 120 may be electrically connected to the chip interconnection terminal 201 of the signal processing chip 200. In one embodiment, the electrical connection part 120 may include a surface contact pad 121 disposed on the first surface 100a of the pixel circuit substrate 100, and an electrical connection block 122 superposed on the surface contact pad 121 and located in the bonding layer 300. Two terminals of the third conductive plug 113 may be electrically connected to the circuit interconnection terminal 101 of the readout circuit and the surface contact pad 121 disposed on the first surface 100a, respectively. The electrical connection block 122 may be in contact with and electrically connected to the surface contact pad 121 as well as the chip interconnection terminal 201 of signal processing chip 200. In one embodiment, the interconnection structure 110 may further include the above-described first conductive plug 111 to be electrically connected to the redistribution layer disposed on the second surface 100b.

The CMOS image sensor packaging structure in the present disclosure may further include the redistribution layer (RDL) 500 laid on the second surface 100b of the pixel circuit substrate 100. In one embodiment, referring to FIG.

4, the redistribution layer 500 may be electrically connected to the interconnection structure 110 by covering the terminals facing toward the second surface 100b of the first conductive plug 111 and the second conductive plug 112. The redistribution layer 500 may include redistribution wires and a pad (I/O pad) electrically connected to the redistribution wires. The pad may be used to be connected to any other external signal or device, to process or control the electrical signal transmitted by the redistribution. To avoid the influence on the incident light in the photosensitive region I, the redistribution layer 500 may be laid on the second surface 100b corresponding to the peripheral region of the pixel circuit substrate 100.

It should be noted that the interconnection structure 110 and the redistribution layer 500 in the drawings are merely examples. In certain embodiments, the redistribution layer may be connected to the first conductive plug 111 and the second conductive plug 112, respectively. Each of the interconnection structure 110 and the redistribution layer and the electrical connection therebetween may be designed according to a specific circuit to achieve a predetermined function, which are not limited to the drawings.

The CMOS image sensor packaging structure in the present disclosure may realize electrical interconnection between the signal processing chip 200 and the pixel circuit substrate 100, which may facilitate reducing the size of the pixel circuit substrate, such that the overall size of the packaging structure may be substantially small. In addition, compared with the chip formed in the pixel circuit substrate, the signal processing chip may be an independent chip. On the one hand, desired computing power and image quality may be provided, and on the other hand, the defective chip on the wafer may be discarded before bonding. Therefore, the process difficulty may be substantially low compared with the wafer-level bonding method.

The present disclosure also provides a method for forming a CMOS image sensor packaging structure, which may be used to fabricate the above-disclosed CMOS image sensor packaging structure.

FIG. 1 illustrates a schematic cross-sectional view of a pixel circuit substrate in a method for forming a CMOS image sensor packaging structure consistent with various disclosed embodiments of the present disclosure. Referring to FIG. 1, the method for forming the CMOS image sensor packaging structure in the present disclosure may include a first step: providing a pixel circuit substrate 100 and a signal processing chip 200. The pixel circuit substrate 100 may include a photosensitive region I and a readout circuit region II. A pixel array of the CMOS image sensor may be disposed in the photosensitive region I. A readout circuit may be disposed in the readout circuit region II. The readout circuit may comprise a circuit interconnection terminal 101, and the pixel circuit substrate 100 may include a first surface 100a and a second surface 100b that are oppositely disposed.

In one embodiment, the signal processing chip 200 may be an image signal processing (ISP) chip, which may include a chip interconnection terminal 201. The respective features of the pixel circuit substrate 100 and the signal processing chip 200 may refer to corresponding descriptions associated with the above-disclosed CMOS image sensor packaging structure. In addition, the first step may include providing one or more dummy chips 10, which may be subsequently bonded onto the surface of the pixel circuit substrate 100 corresponding to a bonding position of the signal processing chip 200 to control the overall warpage of the packaging structure. In one embodiment, the CMOS image sensor may be a back-illuminated CMOS image sensor. Further, the incident light may enter the photodiode in the pixel unit from the first surface 100a or the second surface 100b of the pixel circuit substrate 100. Because the photodiode is formed in the photosensitive region, the signal processing chip may be bonded to the peripheral region of the pixel circuit substrate 100, or may be bonded on a side surface opposite to a surface on which the light is incident, thereby avoiding the influence on the photosensitive performance.

Figure 2:
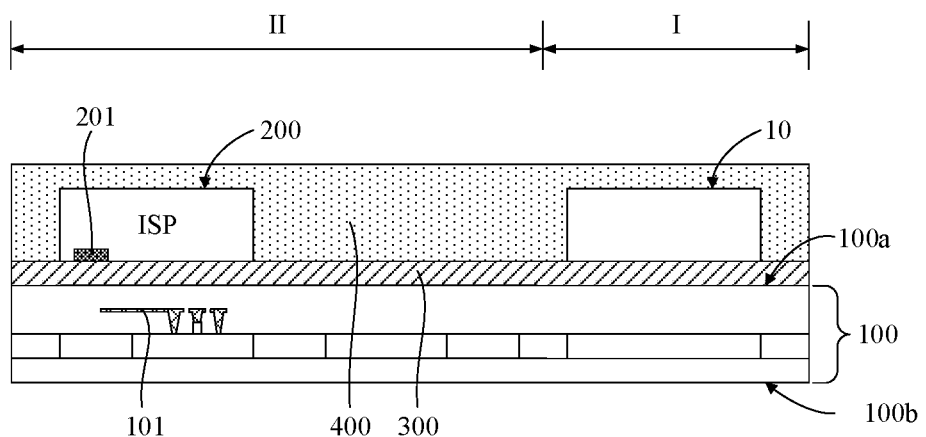
FIG. 2 illustrates a schematic cross-sectional view of a semiconductor structure after forming a bonding layer and a signal processing chip on a pixel circuit substrate in a method for forming a CMOS image sensor packaging structure consistent with various disclosed embodiments of the present disclosure.

FIG. 2 illustrates a schematic cross-sectional view of a semiconductor structure after forming a bonding layer and a signal processing chip on a pixel circuit substrate in a method for forming a CMOS image sensor packaging structure consistent with various disclosed embodiments of the present disclosure. Referring to FIG. 2, the method for forming the CMOS image sensor packaging structure in the present disclosure may also include a second step: bonding the signal processing chip 200 onto the pixel circuit substrate 100 by using a bonding layer 300. The bonding layer 300 may be laid on the first surface 100a of the pixel circuit substrate 100.

In one embodiment, the pixel circuit substrate 100 and the signal processing chip 200 may be bonded together by a bonding method, e.g., fusion bonding or vacuum bonding. In view of this, the bonding layer 300 may be made of a bonding material, e.g., silicon oxide, and silicon oxynitride, etc. In certain embodiments, the pixel circuit substrate and the signal processing chip may be adhered together by means of adhesive bonding and photo (or thermal) curing. In view of this, the bonding layer 300 may further include an adhesive material, e.g., a die attach film or a dry film. To facilitate the electrical connection between the signal processing chip 200 and the readout circuit in the pixel circuit substrate 100, the surface of the chip interconnection terminal 201 of the signal processing chip 200 may face toward and be bonded or adhered to the first surface 100a of the pixel circuit substrate 100. In one embodiment, the signal processing chip 200 may be disposed in the peripheral region of the pixel circuit substrate 100, e.g., the readout circuit region II, to avoid the influence on the pixel unit in the photosensitive region I. To control the warpage of the packaging structure, one or more dummy chips 10 (e.g., a silicon chip) may be bonded or adhered in the photosensitive region I by using the bonding layer 300. The dummy chip 10 may be bonded to the surface opposite to the surface on which light is incident. In one embodiment, the second surface 100b may be the surface on which light is incident, such that the dummy chip 10 may be disposed on the first surface 100a corresponding to the photosensitive region 1.

To protect the pixel circuit substrate 100, the signal processing chip 200, and the electrical connection therebetween, and to enable the signal processing chip 200 to be substantially stable, referring to FIG. 2, after bonding the signal processing chip 200 and the dummy chip 10 onto the first surface 100a of the pixel circuit substrate 100, the method for forming the CMOS image sensor packaging structure in the present disclosure may further include forming an encapsulation layer 400 over the first surface 100a. The encapsulation layer 400 may cover the bonding layer 300 exposed on the first surface 100a, the signal processing chip 200, and the dummy chip 10. The encapsulation layer 400 may include an inorganic insulating material, e.g., silicon oxide, silicon nitride, silicon carbide, silicon oxynitride, etc. The encapsulation layer 400 may also include thermoplastic resin, e.g., polycarbonate, polyethylene terephthalate, polyether sulfone, polyphenylene ether, polyamide, polyetherimide, methacrylic resin, or cyclic polyolefin resin, etc. In addition, the encapsulation layer 400 may include a thermosetting resin, e.g., epoxy resin, phenol resin, urea-formaldehyde resin, formaldehyde resin, polyurethane, acrylic resin, vinyl ester resin, polyimide resin, urea resin, or melamine resin, etc. Further, the encapsulation layer 400 may include an organic insulating material, e.g., polystyrene, or polyacrylonitrile, etc. In one embodiment, the encapsulation layer 400 may be formed by a chemical vapor deposition process, or an injection molding process.

Figure 3:
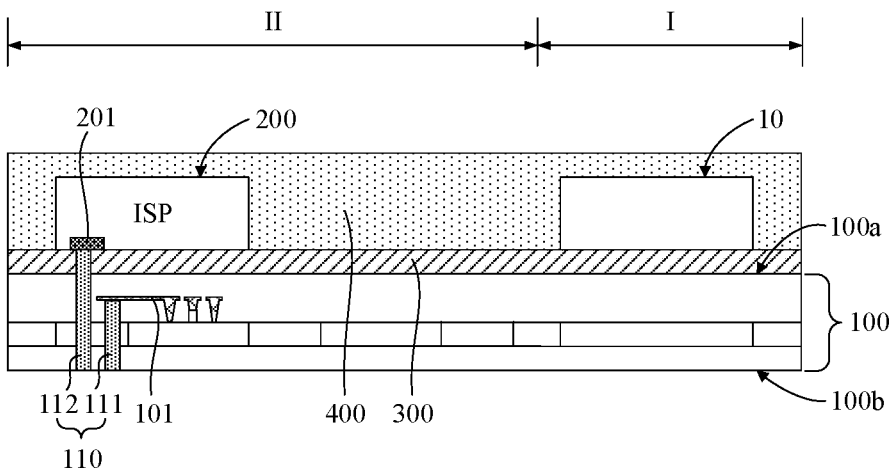
FIG. 3 illustrates a schematic cross-sectional view of a semiconductor structure after forming an interconnection structure in a method for forming a CMOS image sensor packaging structure consistent with various disclosed embodiments of the present disclosure.

FIG. 3 illustrates a schematic cross-sectional view of a semiconductor structure after forming an interconnection structure in a method for forming a CMOS image sensor packaging structure consistent with various disclosed embodiments of the present disclosure. Referring to FIG. 3, the method for forming the CMOS image sensor packaging structure in the present disclosure may further include a third step: forming an interconnection structure 110. The interconnection structure 110 may be electrically connected to the chip interconnection terminal 201 of the signal processing chip 200 and the circuit interconnection terminal 101 of the readout circuit.

The interconnection structure 110 may include one or more electrical contacts, an electrical connection structure, and an electrical connection wire formed therebetween disposed in the pixel circuit substrate 100 and the bonding layer 300. In one embodiment of the present disclosure, the method for forming the interconnection structure 110 may include forming a first conductive plug 111 in the pixel circuit substrate 100. The first conductive plug 111 may be electrically connected to the circuit interconnection terminal 101 of the readout circuit and a redistribution layer subsequently formed on the second surface 100*b* of the pixel circuit substrate 100. In another embodiment, the method for forming the interconnection structure 110 may further include forming a second conductive plug 112 in the pixel circuit substrate 100 and the bonding layer 300 by a manner penetrating through the pixel circuit substrate 100 and the bonding layer 300. The second conductive plug 112 may be electrically connected to the chip interconnection terminal 201 of the signal processing chip 200 and redistribution layer subsequently formed on the second surface 100*b* of the pixel circuit substrate 100. For illustrative purposes, the present disclosure uses the CMOS image sensor packaging structure illustrated in FIG. 4 as an example. The interconnection structure 110 may include the first conductive plug 111 and the second conductive plug 112. A terminal of the first conductive plug 111 may be in contact with and electrically connected to the circuit interconnection terminal 101 of the readout circuit, and another terminal thereof may be exposed on the second surface 100*b*. A terminal of the second conductive plug 112 may be in contact with and electrically connected to the chip interconnection terminal 201 of the signal processing chip 200, and another terminal thereof may be exposed on the second surface 100*b*. The interconnection structure 110 may be electrically connected to the chip interconnection terminal 201 of the signal processing chip 200 and the circuit interconnection terminal 101 of the readout circuit.

The first conductive plug 111 and the second conductive plug 112 may be formed using methods disclosed in the art. As an example, the method may include following steps. First, a first through-hole and a second through-hole may be formed on the second surface 100*b* of the pixel circuit substrate 100 by using a mask and an etching process. Specifically, the first through-hole may penetrate through a portion of the pixel circuit substrate 100 along a thickness direction to expose the circuit interconnection terminal 101 of the readout circuit on the second surface 100*b*. The second through-hole may penetrate through the pixel circuit substrate 100 and the bonding layer 300 to expose the chip interconnection terminal 201 of the signal processing chip 200 on the second surface 100*b*. The first through-hole and the second through-hole may be formed in the readout circuit region II of the pixel circuit substrate 100, to avoid the influence on the photosensitive layer in the photosensitive region I. Second, the first through-hole and the second through-hole may be filled with a conductive material to form the first conductive plug 111 and the second conductive plug 112, respectively. The conductive material may be filled by using hole-filling methods disclosed in the art, e.g., a physical vapor deposition (PVD), a chemical vapor deposition (CVD), or an electroplating method, etc. The conductive material may be selected from a metal or alloy containing elements such as cobalt, molybdenum, aluminum, copper, tungsten, etc. The conductive material may also be selected from a metal silicide (e.g., titanium silicide, tungsten silicide, cobalt silicide, etc.), or a metal nitride (e.g., titanium nitride), etc. However, the methods for forming the first conductive plug 111 and the second conductive plug 112 are not limited by the present disclosure. For example, in another embodiment, after forming the first conductive plug 111, which may be formed by forming the first through-hole and then filling the first through-hole with the conductive material, the second through-hole may be formed, which may be formed by forming the second through-hole and then filling the second through-hole with the conductive material. In addition, after forming the first conductive plug 111 and the second conductive plug 112, the conductive material covering the second surface 100*b* may be removed by a chemical mechanical polishing (CMP) process.

FIG. 4 illustrates a schematic cross-sectional view of a semiconductor structure after forming a redistribution layer in a method for forming a CMOS image sensor packaging structure consistent with various disclosed embodiments of the present disclosure. Referring to FIG. 4, the method for forming the CMOS image sensor packaging structure in the present disclosure may include a fourth step: forming a redistribution layer 500 on the second surface 100*b* of the pixel circuit substrate 100. The redistribution layer 500 may be electrically connected to the interconnection structure 110.

In one embodiment, the redistribution layer 500 may cover the dielectric layer disposed on the second surface 100*b* of the pixel circuit substrate 100, and may be in contact with and electrically connected to the above-described first conductive plug 111 and the second conductive plug 112, such that the redistribution layer 500 may be electrically connected to the interconnection structure 110. In one embodiment, the redistribution layer 500 may be formed by depositing a metal layer on the second surface 100*b* of the pixel circuit substrate 100 using a process, e.g., a physical vapor deposition (PVD), an atomic layer deposition (ALD), or a chemical vapor deposition (CVD), etc., and then performing a patterning process to form the redistribution layer 500. The redistribution layer 500 may be formed using methods disclosed in the art.

The redistribution layer 500 may further include redistribution and a pad (I/O pad) electrically connected to the redistribution. The redistribution layer 500 may perform redistribution on electrical connection between the signal processing chip 200 and the pixel circuit substrate 100 according to design requirements. The pad electrically connected to the redistribution may be used to connect the redistribution layer to an external signal or device of the packaging structure to process or control the electrical signals transmitted by the redistribution.

Figure 5:
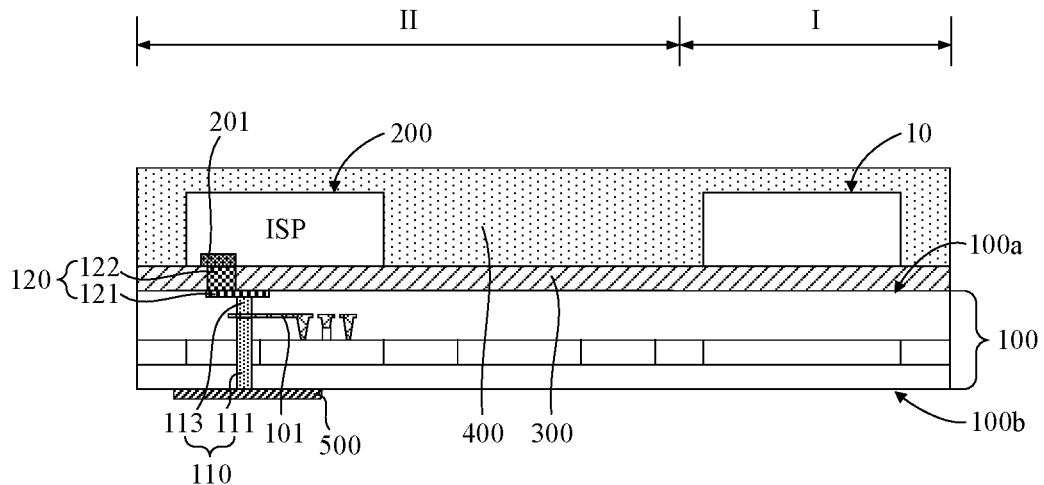
FIG. 5 illustrates a schematic cross-sectional view of a CMOS image sensor packaging structure consistent with various disclosed embodiments of the present disclosure.

In another embodiment, a CMOS image sensor packaging structure as illustrated in FIG. 5 may be formed. Compared with the method for forming the above-described CMOS image sensor packaging structure (as illustrated in FIG. 4), the main difference may include the following. Before bonding the signal processing chip 200 onto the pixel circuit substrate 100, a third conductive plug 113 and a surface contact pad 121 electrically connected thereto may be successively formed on the first surface 100a of the pixel circuit substrate 100, and another terminal of the third conductive plug 113 may be electrically connected to the circuit interconnection terminal 101 of the readout circuit. After bonding the signal processing chip 200 onto the first surface 100a, an opening may be formed in the bonding layer 300 to expose the surface contact pad 121 and the chip interconnection terminal 201, and then the electrical connection block 122 may be formed in the opening by a plating or electroless plating process to electrically connect the surface contact pad 121 and the chip interconnection terminal 201. After forming the encapsulation layer 400, the first conductive plug 111 may be formed in the pixel circuit substrate 100. The formed interconnection structure 110 may include the first conductive plug 111 and the electrical connection part 120 including the surface contact pad 121 and the electrical connection block 122. Further, the interconnection structure 110 may be electrically connected to the chip interconnection terminal 201 of the signal processing chip 200, the circuit interconnection terminal 101 of the readout circuit, and the redistribution layer 500.

In the disclosed method for forming the CMOS image sensor packaging structure, the electrical interconnection between the signal processing chip 200 and the pixel circuit substrate 100 may be realized, which may increase design margin of the pixel circuit substrate 100, and may facilitate reducing the overall size of the packaging structure. In addition, the signal processing chip 200 may be a bonded chip. On the one hand, desired computing power and image quality may be provided, and on the other hand, the defective chip on the signal processing wafer may be discarded before being bonded to the pixel circuit substrate. Therefore, the process difficulty may be substantially low compared with the wafer-level bonding method.

The present disclosure further provides a camera device, which may comprise the CMOS image sensor packaging structure in the disclosed embodiments of the present disclosure. The camera device in the disclosed embodiments of the present disclosure may be a micro camera, a digital camera, or any other suitable electronic device having a micro camera function, e.g., a mobile phone, a tablet, a notebook computer, smart glasses, a digital helmet, a monitor, etc. The camera device in the disclosed embodiments of the present disclosure may achieve a substantially small size and desired image quality by employing the CMOS image sensor packaging structure in the disclosed embodiments of the present disclosure.

In the disclosed CMOS image sensor packaging structure in the present disclosure, the electrical interconnection between the signal processing chip and the pixel circuit substrate may be realized. The signal processing chip may be disposed on the pixel circuit substrate, and the signal processing circuit having the same function may not desire to be disposed on the substrate, which may facilitate reducing the overall size of the packaging structure without reducing the image quality, and improving the structure of the packaging structure.

In the disclosed method for forming the CMOS image sensor packaging structure in the present disclosure, the above-disclosed CMOS image sensor packaging structure may be formed. Further, the signal processing chip may be bonded onto the pixel circuit substrate, and the signal processing circuit having the same function may not desire to be disposed on the substrate, which may facilitate reducing the overall size of the packaging structure. In addition, the bonded signal processing chip may facilitate providing desired computing power and image quality. Further, a defective chip on the wafer may be discarded when being bonded, and, thus, the process difficulty may be substantially low compared with the wafer-level bonding method.

The method and structure in the present disclosure are described in a progressive manner, and the subsequent methods and structures focus on the differences from the prior methods and structures, and the relevant points may be understood by reference.

The above detailed descriptions only illustrate certain exemplary embodiments of the present disclosure, and are not intended to limit the scope of the present disclosure. Those skilled in the art can understand the specification as whole and technical features in the various embodiments can be combined into other embodiments understandable to those persons of ordinary skill in the art. Any equivalent or modification thereof, without departing from the spirit and principle of the present disclosure, falls within the true scope of the present disclosure.

What is claimed is:

1. A CMOS image sensor packaging structure, comprising:
    a pixel circuit substrate, including a photosensitive region and a readout circuit region, wherein a pixel array of the CMOS image sensor is disposed in the photosensitive region, a readout circuit is disposed in the readout circuit region, the pixel circuit substrate includes a first surface and a second surface that are oppositely disposed, and the photosensitive region is laterally disposed with respect to the readout circuit region;
    a bonding layer, disposed on the first surface;
    a signal processing chip, disposed above the first surface through the bonding layer;
    an interconnection structure, electrically connected to a chip interconnection terminal of the signal processing chip and a circuit interconnection terminal of the readout circuit; and
    a redistribution layer, disposed on the second surface, wherein the redistribution layer is electrically connected to the interconnection structure.

2. The packaging structure according to claim 1, wherein:
    the interconnection structure includes a first conductive plug disposed in the pixel circuit substrate, and
    the first conductive plug is electrically connected to the circuit interconnection terminal and the redistribution layer.

3. The packaging structure according to claim 1, wherein:
    the interconnection structure includes a second conductive plug penetrating through the pixel circuit substrate and the bonding layer, and
    the second conductive plug is electrically connected to the chip interconnection terminal and the redistribution layer.

4. The packaging structure according to claim 1, wherein:
    the interconnection structure includes another conductive plug disposed in the pixel circuit substrate and an electrical connection part disposed on the first surface, wherein the another conductive plug is electrically connected to the circuit interconnection terminal and the electrical connection part, and the electrical connection part is electrically connected to the chip interconnection terminal.

5. The packaging structure according to claim 4, wherein: the electrical connection part includes a surface contact pad disposed on the first surface and an electrical connection block superposed on the surface contact pad and located in the bonding layer, wherein two terminals of the third conductive plug are electrically connected to the circuit interconnection terminal and the surface contact pad, respectively, and the electrical connection block is electrically connected to the surface contact pad and the chip interconnection terminal.

6. The packaging structure according to claim 1, wherein: the signal processing chip is disposed above the first surface corresponding to the readout circuit region.

7. The packaging structure according to claim 1, further including:
an encapsulation layer, disposed above the first surface and covering the bonding layer and the signal processing chip.

8. The packaging structure according to claim 7, further including:
a dummy chip, disposed above the first surface through the bonding layer, wherein the encapsulation layer covers the dummy chip.

9. The packaging structure according to claim 8, wherein: when incident light enters the pixel array from the second surface, the dummy chip is disposed above the first surface corresponding to the photosensitive region.

10. The packaging structure according to claim 1, wherein:
the CMOS image sensor is a back-illuminated CMOS image sensor.

11. The packaging structure according to claim 1, wherein:
the bonding layer includes an adhesive material.

12. The packaging structure according to claim 11, wherein:
the bonding layer is made of a dry film.

13. The packaging structure according to claim 1, wherein:
the redistribution layer includes redistribution wires and a pad electrically connected to the redistribution wires.

14. A camera device, comprising:
a CMOS image sensor packaging structure, including:
a pixel circuit substrate, including a photosensitive region and a readout circuit region, wherein a pixel array of the CMOS image sensor is disposed in the photosensitive region, a readout circuit is disposed in the readout circuit region, the pixel circuit substrate includes a first surface and a second surface that are oppositely disposed, and the photosensitive region is laterally disposed with respect to the readout circuit region;
a bonding layer, disposed on the first surface;
a signal processing chip, disposed above the first surface through the bonding layer;
an interconnection structure, electrically connected to a chip interconnection terminal of the signal processing chip and a circuit interconnection terminal of the readout circuit; and
a redistribution layer, disposed on the second surface, wherein the redistribution layer is electrically connected to the interconnection structure.

15. A method for forming a CMOS image sensor packaging structure, comprising:
providing a pixel circuit substrate and a signal processing chip, wherein the pixel circuit substrate includes a photosensitive region and a readout circuit region, a pixel array of the CMOS image sensor is disposed in the photosensitive region, a readout circuit is disposed in the readout circuit region, the readout circuit includes a circuit interconnection terminal, the pixel circuit substrate includes a first surface and a second surface that are oppositely disposed, the photosensitive region is laterally disposed with respect to the readout circuit region, and the signal processing chip includes a chip interconnection terminal;
bonding the signal processing chip onto the pixel circuit substrate by using a bonding layer, wherein the bonding layer is disposed on the first surface;
forming an interconnection structure, wherein the interconnection structure is electrically connected to the chip interconnection terminal of the signal processing chip and the circuit interconnection terminal of the readout circuit; and
forming a redistribution layer on the second surface, wherein the redistribution layer is electrically connected to the interconnection structure.

16. The method according to claim 15, wherein forming the interconnection structure includes:
forming a first conductive plug in the pixel circuit substrate, wherein the first conductive plug is electrically connected to the circuit interconnection terminal and the redistribution layer.

17. The method according to claim 15, wherein forming the interconnection structure includes:
forming a second conductive plug in the pixel circuit substrate and the bonding layer, wherein the second conductive plug is electrically connected to the chip interconnection terminal and the redistribution layer.

18. The method according to claim 15, before forming the redistribution layer, further including:
forming an encapsulation layer above the first surface, wherein the encapsulation layer covers the bonding layer and the signal processing chip.

19. The method according to claim 18, before forming the encapsulation layer, further including:
bonding a dummy chip onto the pixel circuit substrate by using the bonding layer, wherein the encapsulation layer covers the dummy chip.

20. The method according to claim 19, wherein:
the signal processing chip is disposed above the first surface corresponding to the readout circuit region; and
when incident light enters the pixel array from the second surface, the dummy chip is disposed above the first surface corresponding to the photosensitive region.

* * * * *